United States Patent
Dahmani et al.

(10) Patent No.: US 11,313,030 B2
(45) Date of Patent: Apr. 26, 2022

(54) METHOD OF FORMING A THIN FILM OF TANTALUM WITH LOW RESISTIVITY

(71) Applicant: X-FAB FRANCE, Corbeil Essonnes (FR)

(72) Inventors: Faiz Dahmani, La Varenne Saint-Hilaire (FR); Jean-Pierre Cornier, Draveil (FR); Philippe Becquet, Pringy (FR); Yannick Legall, Savigny le Temple (FR); Marc Cotto, Verrieres-le-Buisson (FR)

(73) Assignee: X-FAB FRANCE, Corbeil Essonnes (FR)

( * ) Notice: Subject to any disclaimer, the term of this patent is extended or adjusted under 35 U.S.C. 154(b) by 0 days.

(21) Appl. No.: 16/945,255

(22) Filed: Jul. 31, 2020

(65) Prior Publication Data

US 2021/0062320 A1    Mar. 4, 2021

(30) Foreign Application Priority Data

Aug. 2, 2019    (FR) ...................................... 1908933

(51) Int. Cl.

| C23C 14/14 | (2006.01) |
|---|---|
| C23C 14/34 | (2006.01) |
| C23C 14/54 | (2006.01) |
| C23C 14/56 | (2006.01) |

(Continued)

(52) U.S. Cl.
CPC .......... *C23C 14/14* (2013.01); *C23C 14/3457* (2013.01); *C23C 14/54* (2013.01); *C23C 14/56* (2013.01); *C23C 14/5806* (2013.01); *H01J 37/32082* (2013.01)

(58) Field of Classification Search
USPC .......................................................... 427/571
See application file for complete search history.

(56) References Cited

U.S. PATENT DOCUMENTS

| 5,281,485 A * | 1/1994 | Colgan ................... C23C 14/14 |
|---|---|---|
| | | 204/192.15 |
| 5,834,827 A | 11/1998 | Miyasaka et al. |
| 6,268,288 B1 | 7/2001 | Hautala et al. |

(Continued)

FOREIGN PATENT DOCUMENTS

EP    0593372    *    4/1994    ............. C23C 14/16

OTHER PUBLICATIONS

French Search Report from corresponding French Application No. 1908933, dated Jun. 11, 2020, pp. 1-6, National Institute of Industrial Property, Courbevoie Cedex, France.

(Continued)

*Primary Examiner* — Brian K Talbot
(74) *Attorney, Agent, or Firm* — Hauptman Ham, LLP

(57) ABSTRACT

A method for forming a low-resistivity tantalum thin film having the following steps: depositing a tantalum layer on a substrate, the tantalum of the layer having a β phase, treating the deposited tantalum layer by exposure to a radio frequency hydrogen plasma, such that the layer has tantalum in a mixed β-α phase, at least partially desorbing the hydrogen by carrying out at least one of the following steps: exposure to a radio frequency inert gas plasma, and thermal annealing. The treatment step being configured such that the tantalum layer is subjected to temperatures of less than or equal to 300° C.

18 Claims, 4 Drawing Sheets

(51) Int. Cl.
*C23C 14/58* (2006.01)
*H01J 37/32* (2006.01)

(56) References Cited

U.S. PATENT DOCUMENTS

| | | | |
|---|---|---|---|
| 6,429,524 | B1 | 8/2002 | Cooney, III et al. |
| 6,455,421 | B1 | 9/2002 | Itoh et al. |
| 6,458,255 | B2 | 10/2002 | Chiang et al. |
| 6,841,044 | B1 | 1/2005 | Ruzic |
| 7,129,161 | B2 | 10/2006 | Donohue |
| 2001/0018137 | A1* | 8/2001 | Chiang ............... C23C 14/0641 428/698 |
| 2005/0048775 | A1* | 3/2005 | Donohue .......... H01L 21/76876 438/685 |
| 2005/0208767 | A1* | 9/2005 | Ding ................ H01L 21/02266 438/685 |
| 2007/0280848 | A1* | 12/2007 | Narayan ............... C23C 14/548 420/427 |
| 2013/0237053 | A1 | 9/2013 | Ishizaka et al. |
| 2014/0061918 | A1 | 3/2014 | Jezewski et al. |

OTHER PUBLICATIONS

Högberg et al., H., "beta-Ta and alpha-Cr thin films deposited by high power impulse magnetron sputtering and direct current magnetron sputtering in hydrogen containing plasmas," 2014, Physica. B, Condensed matter, (439), 3-8, http://dx.doi.org/10.1016/j.physb.2013.11.038.

Waechtler et al., T., "Optical Properties of Sputtered Tantalum Nitride Films Determined by Spectroscopic Ellipsometry," Chemnitz University of Technology, Center for Microtechnologies, Chemnitz, Germany and SENTECH Instruments GmbH, Berlin, Germany.

Senkevich et al., J.J., "Formation of body-centered-cubic tantalum via sputtering on low-k dielectrics at lowe temperatures," pp. 534-538, J. Vac. Sci. Technol. B 24(2), Mar./Apr. 2006.

Clevenger et al., L.A., "The relationship between deposition conditions, the beta to alpha phase transformation, and stress relaxation in tantalum think films," pp. 4918-4924, J. Appl. Phys., vol. 72, No. 10, Nov. 15, 1992.

Myers et al., S., "The $\beta$ to $\alpha$ phase transition of tantalum coatings deposited by modulated pulsed power magnetron sputtering," Surface & Coatings Technology 214 (2013) 38-45.

* cited by examiner

METHOD OF FORMING A THIN FILM OF TANTALUM WITH LOW RESISTIVITY

DOMAIN OF THE INVENTION

The invention relates to the field of methods for forming a low-resistivity tantalum (Ta) film, and more particularly the field of methods for forming a tantalum film having a resistivity of less than 20 μΩ·cm (microhm centimeter). One particularly advantageous application is in the field of semiconductor devices, in particular as a barrier layer for the metallisation of conductive tracks and other elements made of copper (Cu).

TECHNOLOGICAL BACKGROUND

For several years, the electrical and structural properties of tantalum thin films have aroused interest for these applications in semiconductor devices, in particular as barrier layers for the metallisation of conductive tracks and other elements made of copper as a result of tantalum's immiscibility with copper, and also since tantalum-based thin films have satisfactory chemical and thermal stabilities. Moreover, tantalum-based barrier layers increase the deposited copper fraction having a crystalline structure (111), and have good adhesion with the copper, and thus the copper-based conductive tracks.

Tantalum, in the metallic form thereof, has two crystalline phases:
  a. an alpha (α) phase, taking the form of a body-centred cubic lattice, having a low resistivity, typically in the range 12 to 60 μΩ·cm, and more particularly in the range 13 to 30 μΩ·cm, and
  b. a beta (β) phase, taking the form of a tetragonal lattice, having a higher resistivity, typically in the range 130 to 220 μΩ·cm.

As a result of the lower resistivity of the alpha phase, the latter is preferred over the beta phase for electronic applications, in particular for thin film interconnects, since it reduces the interconnection resistance.

In a manner known in the prior art, tantalum films are generally deposited by conventional methods involving magnetron cathode sputtering or physical vapour deposition (PVD), however the tantalum thin films thus deposited, and having a typical thickness, in particular a thickness of less than 300 nanometres (nm), are generally present in a metastable tetragonal beta phase.

However, depending on the deposition method and/or technique used, the crystalline structure of the deposited film can correspond to a beta phase, a mixture of beta phase and alpha phase, or solely to a pure alpha phase.

Numerous approaches and methods for forming the alpha phase of tantalum have been proposed.

For example, scientific literature (M. Stavrera et al., J. Vac. Sci. Technol., A 17, 993, (1999)—D. W. Face and D. E. Prober, J. Vac. Sci. Technol., A 5, 3408, (1987)—S. Morohashi, Jpn. J. Appl. Phys., Part 2, 34, L1352, (1995)) and the U.S. Pat. Nos. 5,281,485, 5,834,827, 6,429,524, 2014/0061918 and 6,911,124 disclose that an alpha-phase tantalum thin film can be obtained by magnetron cathode sputtering or PVD using sacrificial sub-layers such as tantalum nitride (TaN), niobium (Nb), titanium nitride (TiN), tungsten (W) or tungsten nitride (WN) sub-layers.

Moreover, L. Maissel and R. Glang, in "Handbook of Thin Film Technology", McGraw-Hill, 18 (1970) disclosed that, when the temperature of the substrate during the deposition exceeds 600° C. (degrees Celsius), the tantalum thin film deposited is present in the alpha phase form thereof.

Other techniques and methods for forming alpha-phase tantalum thin films consist of heat treating the deposited films (M. H. Read and C. Altman, Appl. Phys. Letts. 7 (3), 51, (1965)—S. L. Lee et al., Surf. Coat. Technol. 120/121, 44, (1999)—D. W. Matson et al., Surf. Coat. Technol. 133/134, 411, (2000)) by exploiting the fact that metastable beta-phase tantalum is known to transform into alpha phase when it is heated to a temperature in the range 700 to 1000° C.

Furthermore, the use of noble (inert) sputtering gases that are heavy (atomic weight of greater than 40 grams/mole) such as krypton (Kr) or xenon (Xe) during the deposition of a tantalum layer has been reported to allow the deposited tantalum layer to take the alpha phase thereof (D. W. Matson et al., Surf. Coat. Technol. 146/147, 344, (2001)—D. W. Matson et al., J. Vac. Sci. Technol. A 10 (4), 1791, (1992)).

The methods for forming a tantalum thin film briefly described hereinabove suffer from at least one of the following drawbacks:
  a. the use of a sacrificial sub-layer becomes prohibitive when the target thickness of the barrier layer for the interconnection lines continues to reduce as a result of the shrinking of the technological nodes,
  b. the high substrate temperatures which are not compatible with the thermal budgets for the manufacture of certain devices (which often require maintaining the temperature at less than or equal to 400° C.),
  c. the impossibility of complying with the thermal budgets, in particular in methods using high-temperature heat treatments after the deposition of the tantalum layer, and
  d. the use of heavy noble sputtering gases, which is not economically viable for the microelectronics industry due to the high cost thereof.

One purpose of the present invention is thus to propose a method for forming a low-resistivity tantalum thin film which does not require the use of a sacrificial sub-layer, and/or of heavy noble sputtering gases, and/or high deposition temperatures on a substrate, and/or high-temperature post-deposition treatments that do not comply with the imposed thermal budgets.

Another purpose of the present invention is to propose a method for forming a low-resistivity tantalum thin film that allows tantalum thin films in a pure alpha phase to be formed, in a reproducible manner, having a resistivity of less than or substantially equal to 20 μΩ·cm.

Other purposes, characteristics and advantages of this invention will appear upon reading the following description and its accompanying drawings. It is understood that other advantages can be incorporated thereto.

SUMMARY

In order to reach this objective, according to one embodiment, the present invention provides a method for forming a low-resistivity tantalum thin film, preferably having a resistivity of less than 20 μΩ·cm, comprising the following steps of:
  a. Depositing a tantalum layer on a substrate, the tantalum of the layer having a β phase,
  b. Treating the deposited tantalum layer by exposure to a radio frequency hydrogen (H) plasma, such that the layer has tantalum in a mixed β-α phase, and c. At least partially desorbing the hydrogen by carrying out at least one of the following steps:
   i. Exposure to a radio frequency inert gas plasma, and
   ii. Thermal annealing, the treatment step being configured such that the tantalum layer is subjected to temperatures of less than or equal to 300° C., preferably less than or equal to 250° C., and more preferably less than or equal to 150° C.

More particularly, the method according to one embodiment of the invention provides for:

a. depositing, by conventional, known techniques, a beta-phase tantalum layer on the substrate at an ambient temperature,
b. transforming the beta phase of the tantalum layer, by exposure to a radio frequency hydrogen plasma, into a mixed beta-alpha (β-α) phase, and
c. forming an alpha-phase tantalum layer, preferably in the pure alpha phase, by exposing the mixed beta-alpha phase (β-α) to a radio frequency argon plasma.

The method according to the various embodiments of the invention can be carried out in one or more vacuum "cluster" type systems formed by a plurality of chambers, without a vacuum break or with a vacuum break between the steps thereof.

It thus appears that the method according to the invention allows a low-resistivity tantalum thin film to be formed using neither a sacrificial sublayer nor heavy noble sputtering gases (Kr, Xe).

Moreover, in particular in the absence of thermal annealing, the method according to the invention allows a low-resistivity tantalum thin film to be formed at temperatures and/or without the need for high-temperature post-deposition treatments, and thus complies with the thermal budgets imposed.

The method according to the invention thus allows tantalum thin films to be formed, in a reproducible manner, in an alpha phase that is relatively or perfectly pure, having a resistivity of less than or equal to 20 μΩ·cm.

Optionally, the invention can further have at least one of the following features.

The tantalum layer can be deposited by magnetron cathode sputtering or by physical vapour deposition.

The method can be free of any chemical vapour deposition (CVD) step involving the β-phase tantalum layer. The method according to this feature avoids the use of this deposition technique, which would result in a tantalum layer comprising contaminants originating from the one or more chemical precursors used to form the tantalum layer, for example carbon or oxygen, and would result in a less dense tantalum layer, and thus in a much higher resistivity (greater than 1000 μΩ·cm for a TaN film according to Table 3 of the U.S. Pat. No. 6,268,288) than that obtained by magnetron cathode sputtering or by PVD.

The tantalum layer can be deposited directly on the substrate.

The substrate can be free of any sacrificial layer or any activating layer for the tantalum layer.

The substrate can be free of any tantalum nitride layer (or Nb, TiN, W, WN layer, etc.)

Preferably, exposure to a radio frequency inert gas plasma is carried out in a chamber maintained at a temperature that is substantially equal to ambient temperature.

The deposition of the tantalum layer and the two plasma treatments (hydrogen then argon) of the tantalum layer are preferably carried out in a subsequent manner, the tantalum layer being firstly deposited, then treated.

The deposition of the tantalum layer can be carried out in a chamber maintained at a pressure of less than 40 millitorr (mT), preferably less than 30 mT, more preferably substantially equal to 5 mT.

The deposition of the tantalum layer is preferably configured such that the tantalum layer has a thickness in the range 10 to 40 nm.

The deposition of the tantalum layer (in β phase) is preferably configured such that the tantalum layer has a resistivity substantially equal to 180 μΩ·cm.

The treatment by exposure to a radio frequency hydrogen plasma can be carried out with pure hydrogen in a vacuum chamber at a pressure in the range 2 to 10 Torr (T), and more preferably substantially equal to 6 T. The exposure of the radio frequency hydrogen plasma can thus be carried out at a pressure significantly greater than that at which the deposition of the beta-phase tantalum layer is carried out. This may or may not require a vacuum break as a result of changing chambers between the chamber wherein the deposition of the tantalum layer is carried out and the chamber wherein the tantalum layer is exposed to the radio frequency hydrogen plasma.

The treatment by exposure to a radio frequency hydrogen plasma can be carried out with an incident radio frequency power in the range 100 to 1500 Watts (W), and more preferably substantially equal to 1000 W.

The treatment by exposure to a radio frequency hydrogen plasma can be carried out for a duration in the range 30 to 300 seconds, and more preferably substantially equal to 60 seconds.

The treatment by exposure to a radio frequency hydrogen plasma is preferably configured such that the mixed β-α phase tantalum layer has a resistivity substantially equal to 55 μΩ·cm.

The exposure to a radio frequency inert gas plasma can be carried out with argon, preferably pure, as an inert gas.

The exposure to a radio frequency inert gas plasma can be carried out in a vacuum chamber at a pressure in the range 0.1 to 10 mT, and more preferably substantially equal to 0.5 mT.

The exposure to a radio frequency inert gas plasma is preferably carried out at a temperature that is substantially equal to ambient temperature.

The exposure to a radio frequency inert gas plasma can be carried out with an incident radio frequency power in the range 50 to 500 W, and more preferably substantially equal to 200 W.

The exposure to a radio frequency inert gas plasma can be carried out for a duration in the range 5 to 30 seconds, and more preferably substantially equal to 10 seconds.

The exposure to a radio frequency inert gas plasma is preferably configured such that the α-phase tantalum layer has a resistivity of less than 20 μΩ·cm, and preferably substantially equal to 15 μΩ·cm

BRIEF INTRODUCTION OF THE DRAWINGS

The aims, purposes, characteristics and advantages of the invention will be better understood upon reading the detailed description of one embodiment thereof, which is illustrated by means of the following accompanying drawings, wherein:

FIG. 1 diagrammatically shows the steps of the method according to one embodiment of the invention;

Figure 5:
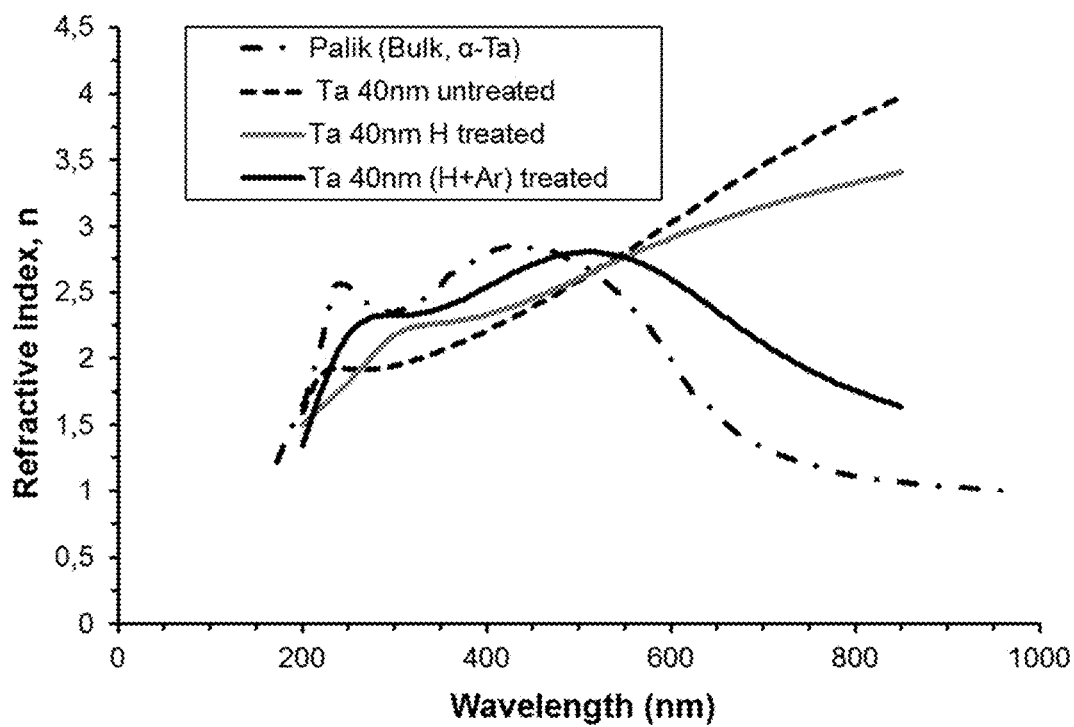
Figure 6:
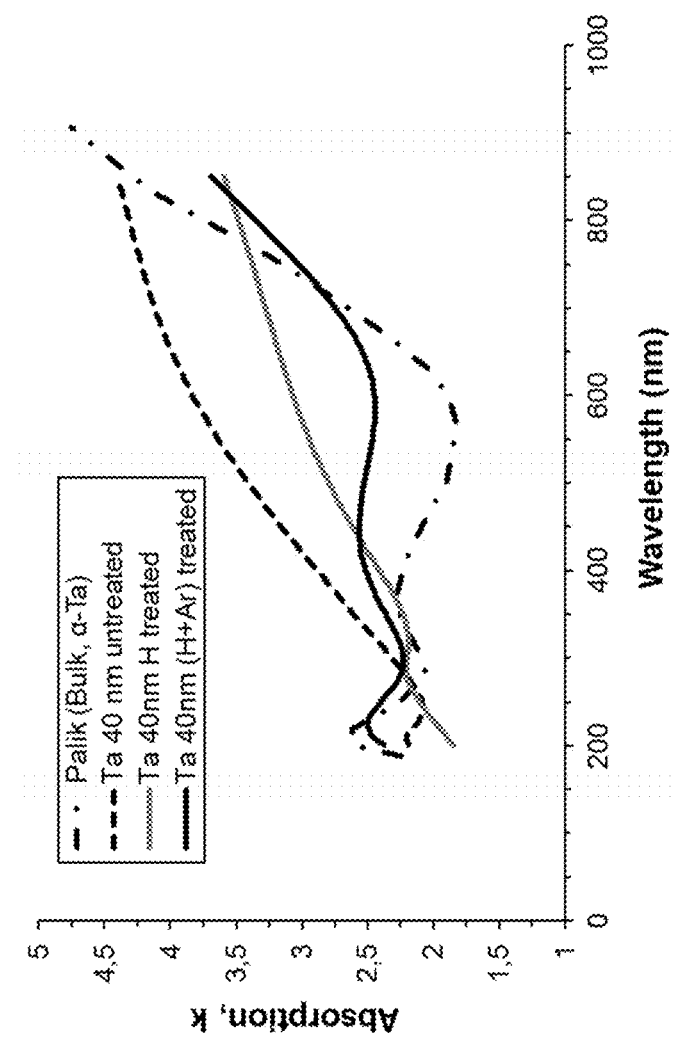

FIG. 5 is a graph showing the evolution in the refractive index of the alpha-phase tantalum layer formed according to one embodiment of the invention, as a function of the wavelength of an incident radiation; and FIG. 6 is a graph showing the evolution in the absorption coefficient of the alpha-phase tantalum layer formed according to one embodiment of the invention, as a function of the wavelength of an incident radiation.

The drawings are provided by way of example and are not intended to limit the scope of the invention. They constitute diagrammatic views intended to ease the understanding of the invention and are not necessarily to the scale of practical applications. In particular, the thicknesses of the different layers shown are not representative of reality.

Figure 1:
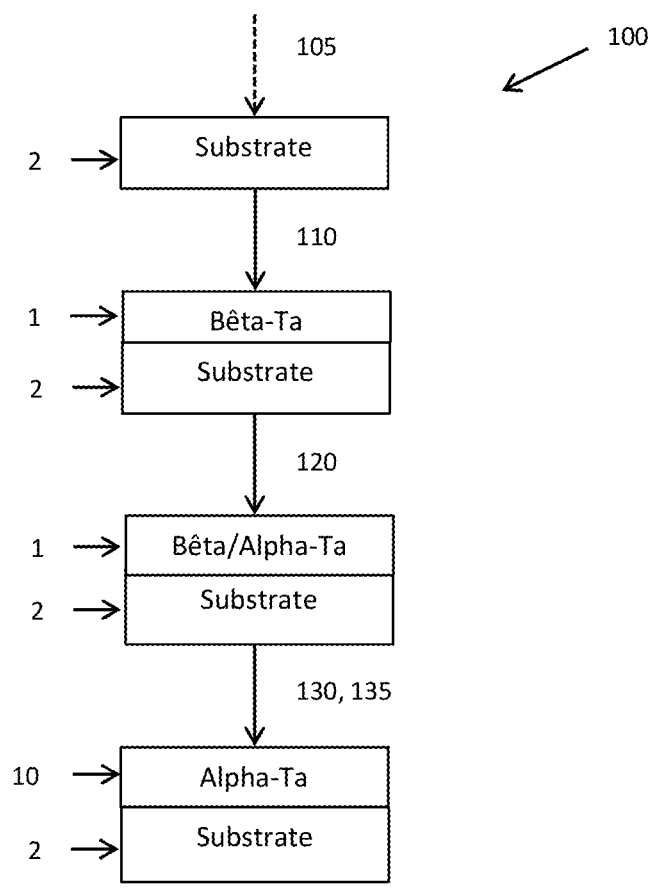

In FIG. 1, the step of the method according to the invention represented by an arrow shown by a dotted line is optional.

DETAILED DESCRIPTION

A parameter that is "substantially equal to/greater than/less than" a given value is understood to mean that this parameter is equal to/greater than/less than the given value, to within more or less 20%, or even to within 10% of this value. A parameter that is "substantially in the range of" two given values is understood to mean that this parameter is at least equal to the lowest value given, to within more or less 20%, or even 10%, of this value, and at most equal to the highest value given, to within more or less 20%, or even 10%, of this value.

"Thermal budget" is understood to mean a quantification of the result of a heat treatment after selecting a temperature value and a duration value for the heat treatment. When a thermal budget is imposed, the temperature value and/or duration of the heat treatment must comply with certain limits. This often consists of not exceeding said limits, for example to guarantee the integrity of the elements to which the heat treatment is applied. This thermal budget is conventionally that used in the back-end-of-line (BEOL) manufacturing steps, in particular during the interconnection of the active elements such as transistors, etc. to form an electric circuit.

The present invention relates to a method for forming, in a reproducible and irreversible manner, tantalum thin films having a low resistivity on a substrate. The method according to the invention has the advantage of not using a sub-layer made of tantalum nitride or any other material (Nb, TiN, W, WN, etc.) favouring a low-resistivity tantalum. The method according to the invention has further advantages over the existing techniques discussed hereinabove.

With reference to FIG. 1, the method 100 according to the invention firstly comprises a deposition step 110, potentially using conventional deposition means, equivalently described as deposition element, for depositing a thin beta-phase tantalum layer 1 on a substrate 2.

This step can be preceded by a step 105 for cleaning the substrate, for example by exposing the substrate to a radio frequency cleaning plasma.

The deposition step 110 is followed, according to one embodiment of the invention, by treatments 120, 135 implementing radio frequency hydrogen and argon plasmas. Said treatments are preferably carried out in a subsequent manner, beginning with a treatment 120 by radio frequency hydrogen plasma, followed by a treatment 135 by radio frequency argon plasma. Each plasma treatment 120, 135 assumes exposure of the tantalum layer 1 to a plasma.

It should be noted that the treatment 135 of the tantalum layer by radio frequency argon plasma can be replaced by a treatment of the tantalum layer by radio frequency plasma, the base whereof contains any other noble gas(es) having an atomic weight of less than or equal to 40 grams/mole. However, due to costs, argon and helium are preferred, argon being preferred over helium.

Unlike known formation methods, the thickness of the tantalum layer 1 as deposited is not required to exceed 10 nm, however the tantalum layer 1 as deposited will have a lower resistivity for thicknesses in the range 20 to 40 nm.

The resistivity of the tantalum layer 1 as deposited is typically substantially equal to 180 μΩ·cm. However, the resistivity of this tantalum layer 1 after the exposure 120 thereof to a radio frequency hydrogen plasma can be lowered to a value substantially equal to 55 μΩ·cm. This resistivity corresponds to a tantalum layer 1 having a mixture of both alpha and beta phases thereof. The resistivity of the tantalum layer 1 can be further lowered, by the subsequent exposure 135 thereof to the radio frequency argon plasma, preferably until the thin film 10 has a value of less than 20 μΩ·cm, preferably substantially equal to 15 μΩ·cm.

Figure 2:
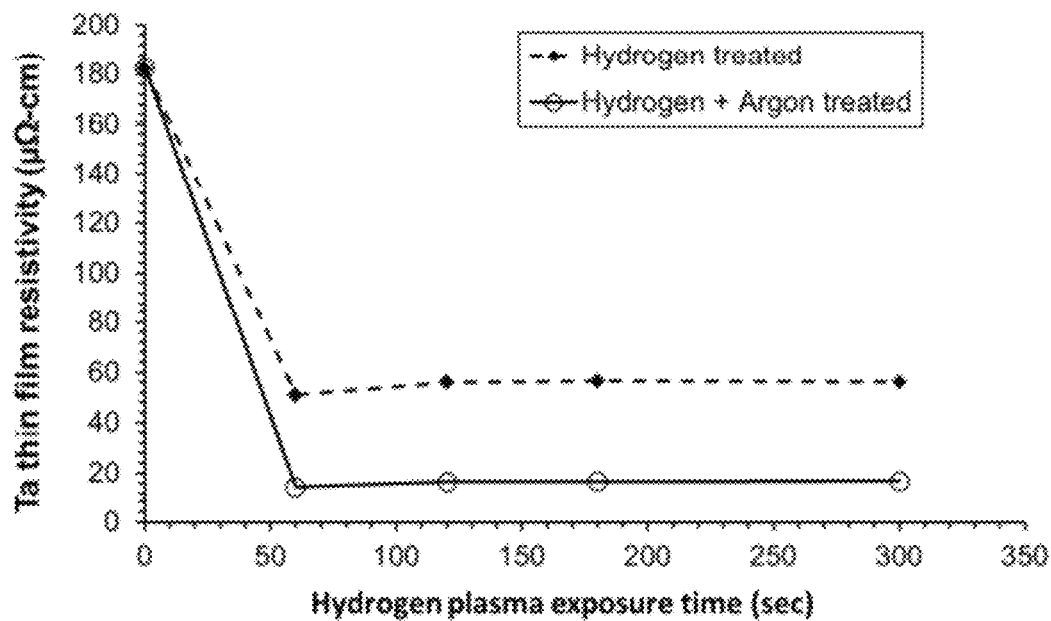
FIG. 2 is a graph showing the effect of the radio frequency hydrogen plasma and the combined effect of the radio frequency hydrogen plasma and the radio frequency argon plasma, on the resistivity of the tantalum layer according to one embodiment of the invention.

FIG. 2 shows the effect of the exposure time of the tantalum layer 1 to a radio frequency hydrogen plasma on the resistivity of the tantalum layer 1. FIG. 2 further shows the effect of the exposure time of the tantalum layer 1 to a radio frequency hydrogen plasma, followed by a 10-second radio frequency argon plasma treatment, on the resistivity of the tantalum layer 1. More particularly, the graph in FIG. 2 was obtained with a hydrogen plasma having an incident power of 1000 W at a pressure of 6 Torr and with a radio frequency argon plasma having an incident power of 200 W at a pressure of 0.5 mT for an exposure time of 10 seconds. The lowest resistivity obtained, under these conditions by implementing the method according to the invention, is substantially equal to 14.4 μΩ·cm. The resistivity measurements carried out on different tantalum thin films treated by hydrogen plasma, then by argon plasma, have shown that this resistivity does not evolve in the few months that follow the implementation of the method according to the invention. This shows the highly stable effects of the hydrogen plasma treatment 120 and argon plasma treatment 135.

Figure 3:
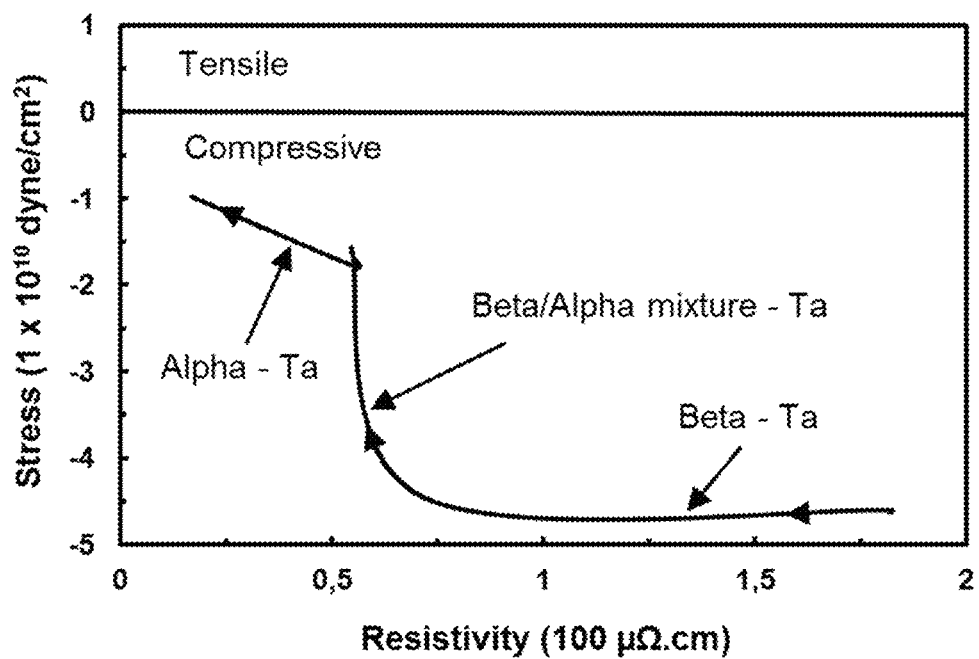
FIG. 3 is a graph showing the evolution in the stress state as a function of resistivity for beta-phase tantalum thin films as deposited, then after the exposure thereof to a hydrogen plasma and an argon plasma according to one of the embodiments of the invention.

Moreover, FIG. 3 shows the stress state in the tantalum layer 1 when the tantalum changes phase as a result of the hydrogen plasma treatment 120 and argon plasma treatment 135. The graph in FIG. 3 clearly shows that the phase transition of tantalum from a tetragonal beta phase to a cubic alpha phase, as a result of the exposures thereof to a radio frequency hydrogen plasma, then to a radio frequency argon plasma, induces a significant decrease in the resistivity of the tantalum layer 1, which was intrinsically under a compressive stress before the treatments 120, 135.

This release of stress caused by the transition from the beta phase to the alpha phase of the tantalum has been demonstrated by L. A. Clevenger et al. (J. Appl. Phys., 72 (10), 4918 (1992)), when the tantalum layer is exposed to a temperature rise to a temperature greater than or equal to 850° C.

Within the scope of the present invention, after the treatment 120 by radio frequency hydrogen plasma, the temperature whereof does not exceed 300° C., a temperature rise is not ruled out. In particular, a thermal annealing can be carried out, in combination with or alternately to the treatment 135 by radio frequency argon plasma.

However, in the preferred embodiment thereof, the method does not comprise thermal annealing to desorb 130, at least partially, preferably fully, the hydrogen with which the tantalum layer 1 was doped during the exposure 120 thereof to the radio frequency hydrogen plasma.

The method according to the invention is thus based on the doping of the tantalum layer 1 by hydrogen atoms, as a result of the treatment 120 of the tantalum layer by a radio frequency hydrogen plasma, then on the removal of the doping hydrogen atoms, as a result of the exposure 135 of the tantalum layer 1 to a radio frequency argon plasma.

It should be noted that the exposure of samples of tantalum thin films solely to a molecular hydrogen flow (without applying a radio frequency power) up to a temperature of 400° C. causes insignificant or no modification to the resistivity of the tantalum forming these thin films. This means, on the one hand, that no molecular hydrogen absorption is effective in the absence of a radio frequency power, and on the other hand that the hydrogen is inserted into the tantalum layer only in atomic form when a radio frequency power is applied, the latter allowing the hydrogen molecule to be split into hydrogen atoms.

Figure 4:
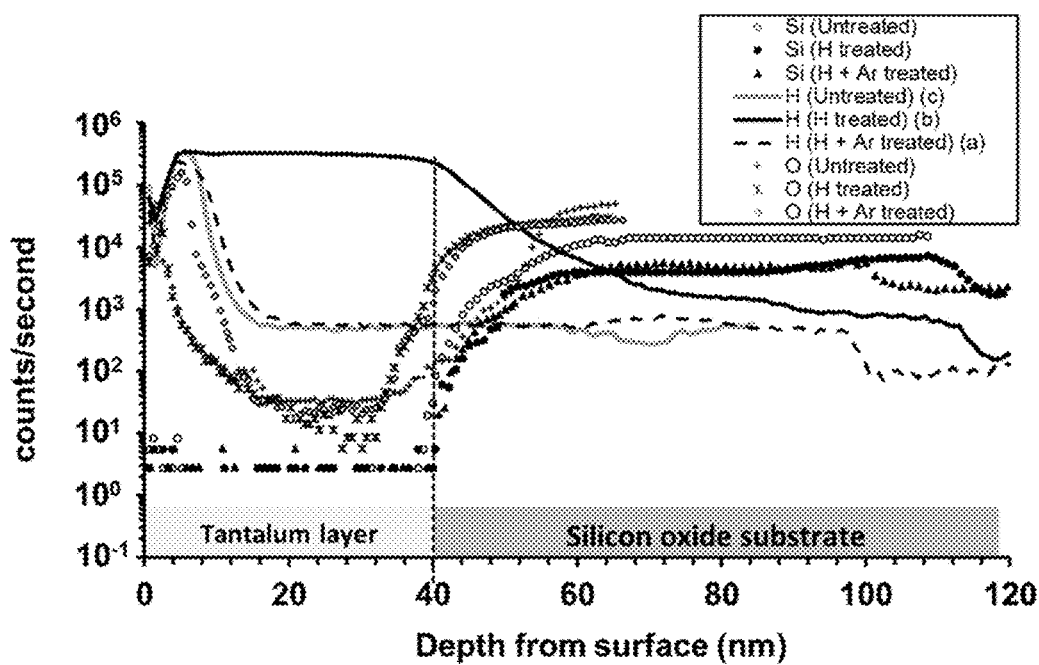
FIG. 4 is a graph showing secondary ion mass spectrometry (SIMS) profiles for hydrogen in tantalum thin films (a) after the exposure thereof to a hydrogen plasma and to an argon plasma, (b) after the exposure thereof to a hydrogen plasma only, and (c) without any exposure whatsoever to a hydrogen plasma and/or an argon plasma.

To confirm the substantial and irreversible lowering of the resistivity of the tantalum layer 1 by inserting hydrogen atoms therein then removing them therefrom, secondary ion mass spectrometry (SIMS) measurements were carried out on samples of untreated tantalum layers, tantalum layers treated by radio frequency hydrogen plasma and tantalum layers treated by radio frequency hydrogen plasma then by radio frequency argon plasma. The SIMS hydrogen profiles obtained for these samples are as shown in FIG. 4. The latter further shows the profiles obtained for silicon (Si) and oxygen (O). The following observations were made based on these SIMS measurements:

a. a uniform distribution of the hydrogen atoms over the thickness of the tantalum layer following the treatment 120 by radio frequency hydrogen plasma, which suggests that the interstitial hydrogen (Hi) is likely responsible for the decrease in the resistivity by increasing the concentration of mobile carriers and the mobility of the mobile carriers, b. the presence of hydrogen solely at the surface of the tantalum layer for untreated layers, and c. the presence of hydrogen solely at the surface of the tantalum layers treated by radio frequency hydrogen plasma, then by radio frequency argon plasma.

As a result of the size of the hydrogen atoms compared to that of the tantalum atoms, the hydrogen atoms naturally occupy the interstitial sites inside the host crystalline structure, in this case the crystalline structure of tantalum. It is suspected that the doping by hydrogen atoms increases the mobility of the conduction electrons in the tantalum layer 1 which then leads to the decrease in resistivity.

Moreover, the presence of hydrogen at the surface of the untreated layers 1 appears to be solely attributed to the hydrogen trapped by the oxygen vacancies ($V_O$) present at the surface of the tantalum layer 1, this surface, potentially formed with a native tantalum oxide base, forming a $V_O$-H complex. As a result, the hydrogen of the layer 1 treated by radio frequency hydrogen plasma is assumed to diffuse at least partially, or even totally, outside of the tantalum layer 1 after the treatment 135 by radio frequency argon plasma. The hydrogen visible at the surface is only the normal consequence of the presence of native tantalum oxide at the surface of the tantalum layer 1 during the exposure thereof to ambient air. Since the activation energy for the hydrogen desorption is about 1.9 eV, it can be assumed that the hydrogen atoms occupying the interstitial sites in the host crystalline structure can be easily desorbed by the hot or energetic electrons produced during the treatment 135 by radio frequency argon plasma. However, the mechanism via which the resistivity of the tantalum is reduced after the diffusion of hydrogen outside of the host crystalline structure does not appear known insofar as the literature relative to the interstitial hydrogen in conducting oxides and/or metals report a decrease in the concentration of mobile carriers and thus an increase in resistivity, when the interstitial hydrogen is diffused outside of the host crystalline structure.

FIGS. 5 and 6 show the refractive index and the absorption coefficient of the alpha-phase tantalum thin film 10 obtained by implementing the method 100 as described hereinabove according to the preferred embodiment thereof. The corresponding ellipsometric results are compared to the data from the works by E. D. Palik (Handbook of Optical Constants of Solids II, Academic Press, 1998), which were obtained for a bulk volume of tantalum, thus in alpha phase. This comparison thus constitutes proof of the results of the method according to the invention.

The invention is not limited to the aforementioned embodiments, and includes all the embodiments covered by the claims.

The invention claimed is:

1. A method for forming a low-resistivity tantalum thin film comprising the steps of:
   depositing an initial tantalum layer on a substrate, wherein the tantalum layer comprises β-phase tantalum;
   exposing the initial tantalum layer to a radio frequency hydrogen plasma to produce a modified tantalum layer comprises a mixture of α-phase tantalum, β-phase tantalum, and absorbed hydrogen; and
   desorbing a portion of the absorbed hydrogen from the modified tantalum layer at a temperature of less than 300° C. to produce a final tantalum layer comprises α-phase tantalum by:
      exposing the modified tantalum layer to a radio frequency inert gas plasma or thermally annealing the modified tantalum layer under an inert gas.

2. The method according to the claim 1, wherein:
   the step of exposing the modified tantalum layer to the radio frequency inert gas plasma is carried out near an ambient temperature.

3. The method according to claim 1, wherein:
   the step of depositing the initial tantalum layer is carried out in a chamber maintained at a pressure of less than 40 mT.

4. The method according to claim 1, wherein:
   the initial tantalum layer has a final deposited thickness in the range of 10 to 40 nm.

5. The method according to claim 1, wherein:
   the initial tantalum layer has a resistivity substantially equal to 180 μΩ·cm.

6. The method according to claim 1, wherein:
the step of exposing the initial tantalum layer to the radio frequency hydrogen plasma is carried out using pure hydrogen in a vacuum chamber under a pressure in the range 2 to 10 Torr.

7. The method according to claim 1, wherein:
the step of exposing the initial tantalum layer to the radio frequency hydrogen plasma is carried out by applying an incident radio frequency power in the range 100 to 1500 W to the absorbed hydrogen.

8. The method according to claim 1, wherein:
the step of exposing the initial tantalum layer to the radio frequency hydrogen plasma has an exposure duration in the range 30 to 300 seconds.

9. The method according to claim 1, wherein:
the modified tantalum layer has a resistivity substantially equal to 55 µΩ·cm.

10. The method according to claim 1, wherein:
the inert gas comprises argon.

11. The method according to claim 1, wherein:
the step of exposing the modified tantalum layer to the radio frequency inert gas plasma is carried out in a vacuum chamber at a pressure in the range 0.1 to 10 mT.

12. The method according to claim 1, wherein:
the step of exposing the modified tantalum layer to the radio frequency inert gas plasma is carried out near an ambient temperature.

13. The method according to claim 1, wherein:
the step of exposing the modified tantalum layer to the radio frequency inert gas plasma is carried out with an incident radio frequency power in the range 50 to 500 W.

14. The method according to claim 1, wherein:
the step of exposing the modified tantalum layer to the radio frequency inert gas plasma has a treatment duration in the range 5 to 30 seconds.

15. The method according to claim 1, wherein:
the final tantalum layer has a resistivity of less than 20 µΩ·cm.

16. The method according to claim 1, wherein:
the step of desorbing the portion of the absorbed hydrogen from the modified tantalum layer is performed at a temperature no greater than 250° C.

17. The method according to claim 1, wherein:
the step of desorbing the portion of the absorbed hydrogen from the modified tantalum layer is performed at a temperature no greater than 150° C.

18. The method according to claim 1, wherein:
the step of depositing the initial tantalum layer on the substrate is carried out in a chamber maintained at a pressure no greater than 30 mT.

* * * * *